United States Patent
Zhou et al.

(10) Patent No.: US 11,849,569 B2
(45) Date of Patent: Dec. 19, 2023

(54) ULTRA-COMPACT CONFIGURABLE DOUBLE-SIDED MANIFOLD MICRO-CHANNEL COLD PLATE

(71) Applicant: Toyota Motor Engineering & Manufacturing North America, Inc, Plano, TX (US)

(72) Inventors: Feng Zhou, Ann Arbor, MI (US); Ercan M. Dede, Ann Arbor, MI (US); Hiroshi Ukegawa, South Lyon, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 436 days.

(21) Appl. No.: 17/085,708

(22) Filed: Oct. 30, 2020

(65) Prior Publication Data

US 2022/0142013 A1  May 5, 2022

(51) Int. Cl.
*H05K 7/20* (2006.01)
*F28F 3/12* (2006.01)

(52) U.S. Cl.
CPC .......... *H05K 7/20927* (2013.01); *F28F 3/12* (2013.01); *H05K 7/20254* (2013.01)

(58) Field of Classification Search
CPC .......... H05K 7/20927; H05K 7/20254; H05K 7/20327; H05K 7/20509; H05K 7/209; F28F 3/12
See application file for complete search history.

(56) References Cited

U.S. PATENT DOCUMENTS

| | | | |
|---|---|---|---|
| 9,437,523 B2 | 9/2016 | Joshi et al. | |
| 9,445,526 B2 | 9/2016 | Zhou et al. | |
| 9,980,415 B2 | 10/2018 | Zhou et al. | |
| 2007/0273359 A1* | 11/2007 | Grupa | G01R 15/202 |
| | | | 361/702 |

(Continued)

FOREIGN PATENT DOCUMENTS

WO    2017031596 A1    3/2017

OTHER PUBLICATIONS

Iranzo et al., "Biomimetic Flow Fields for Proton Exchange Membrane Fuel Cells: A Review of Design Trends," 2020, 37 pages.

(Continued)

*Primary Examiner* — Jacob R Crum
(74) *Attorney, Agent, or Firm* — Jordan IP Law, LLC

(57)    ABSTRACT

A configurable, double sided, manifold micro-channel cold plate includes a one or more manifold micro-channel cold plate cells. Each cold plate cell includes a manifold body, a manifold insert, a plurality of heat sinks, and a plurality of longitudinal openings configured for fluidic communication with the fluid channels. The manifold body has fluid channels to permit flow of a fluid coolant. The manifold insert has a plurality of manifold insert fluid channels, and is configured for receipt in the one of the modular body recesses. The heat sinks are configured for receipt in the modular body recesses, and include an impingement surface configured for fluidic communication with the manifold insert fluid channels, and a heat transfer surface for thermal communication with one or more heat generating devices.

20 Claims, 13 Drawing Sheets

(56) References Cited

U.S. PATENT DOCUMENTS

| | | | | |
|---|---|---|---|---|
| 2014/0251583 A1* | 9/2014 | Eriksen | ............. | H05K 7/20772 |
| | | | | 165/104.33 |
| 2015/0077936 A1* | 3/2015 | Ionescu | ............. | H05K 7/20927 |
| | | | | 361/699 |
| 2016/0381834 A1* | 12/2016 | Harvilchuck | ........... | F16L 37/32 |
| | | | | 285/91 |
| 2017/0055378 A1* | 2/2017 | Zhou | .................. | H05K 7/20927 |
| 2021/0311270 A1* | 10/2021 | Goergen | ............. | G02B 6/4214 |

OTHER PUBLICATIONS

Kloess et al., "Investigation of Bioinspiredflow Channel Designs for Bipolar Plates in Protonexchange Membrane Fuel Cells," Journal of Power Sources, vol. 188, Issue 1, Mar. 1, 2009, pp. 132-140.

Zhou et al., "Modular Design for a Single-Phase Manifold Mini/Microchannel Cold Plate," Journal of Thermal Science and Engineering Applications, vol. 8, Jun. 2016, 13 pages.

Brunschwiler et al. "Dual-side heat removal by micro-channel cold plate and silicon-interposer with embedded fluid channels" IBM Research, 2016, 6 pages.

* cited by examiner

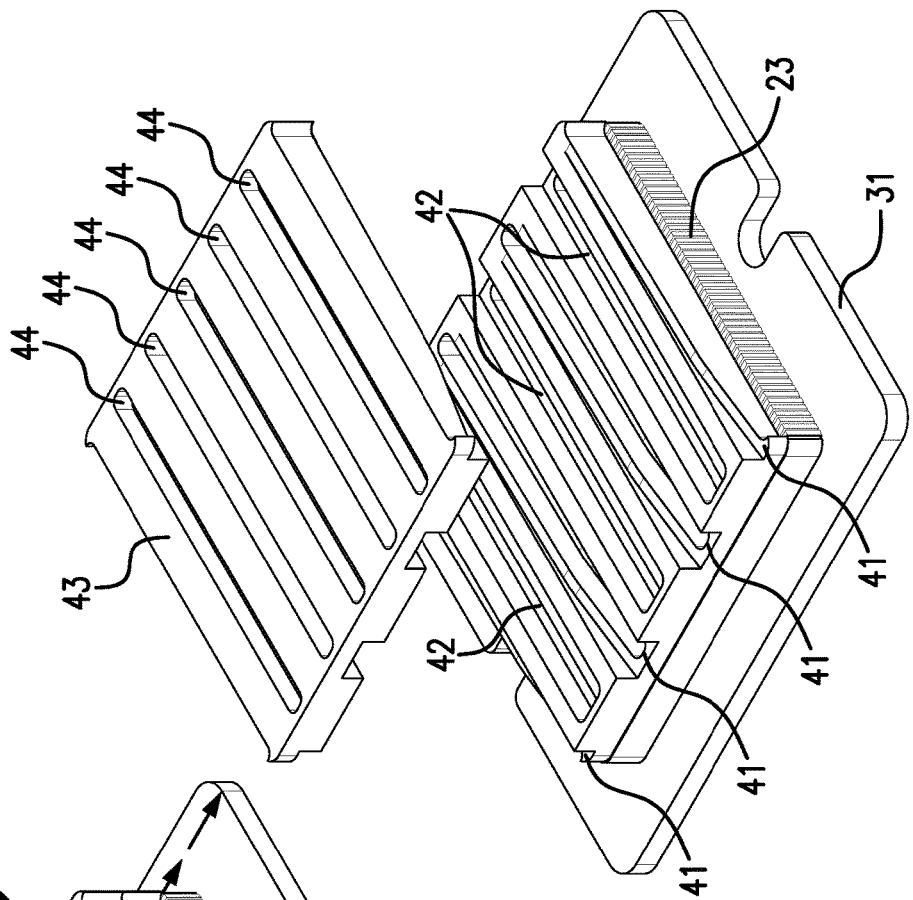
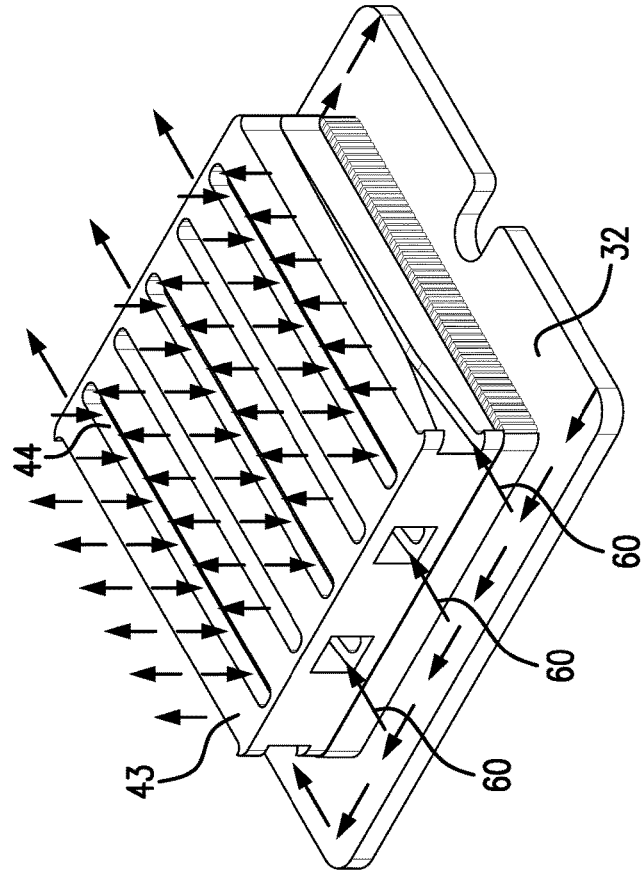
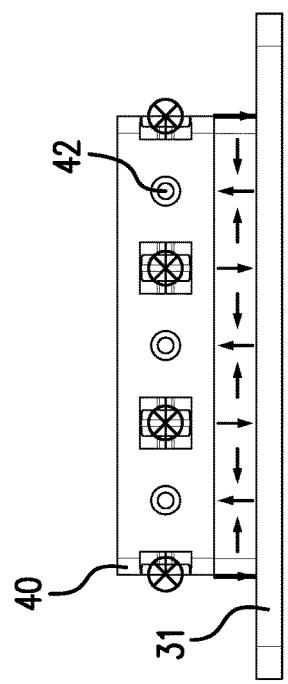
FIG. 3A
FIG. 3B
FIG. 3C

ULTRA-COMPACT CONFIGURABLE DOUBLE-SIDED MANIFOLD MICRO-CHANNEL COLD PLATE

STATEMENT OF GOVERNMENT INTEREST

The subject matter of the present disclosure was developed with government support under Department of Energy Cooperative Agreement DE-AR0000897 awarded by the Advanced Research Projects Agency of the U.S. Department of Energy. Accordingly, the government has certain rights in the subject matter of the present disclosure.

TECHNICAL FIELD

Embodiments relate generally to a configurable, double sided, manifold micro-channel (MMC) cold plate.

BACKGROUND

MMC cold plates are designed to generally have a modular jet impingement feature. Such a design, however, results in the cold plates occupying a considerable percentage of the total volume. In high power density power electric applications, a more compact cold plate is desirable.

BRIEF SUMMARY

Set forth, illustrated, and/or described herein, in accordance with one or more embodiments, is a configurable, double sided, MMC cold plate having a modular, compact design to provide an MMC cold plate having a plurality of different configurations.

In accordance with one or more embodiments, fluid circuit includes a coolant fluid flowing into each MMC cold plate unit cell for distribution by a manifold insert, arranged in a manifold body of the unit cell, into heat plate fins of a heat sink also arranged in the manifold body. The coolant fluid then returns to the manifold insert to flow from the manifold body. The coolant fluid flow path of distributes the coolant fluid into the heat sinks on both the top side and the bottom side of the unit cell via a single manifold insert.

In accordance with one or more embodiments, a manifold micro-channel cold plate cell may comprise one or more of the following: a manifold body including fluid channel network to permit flow of a fluid coolant through the manifold body; a manifold insert, configured for receipt in the modular body, each planar surface of the manifold insert including a plurality of manifold insert fluid channels; and a plurality of heat sinks configured for receipt in the modular body at planar surfaces of the manifold insert, the heat sinks including an impingement surface configured for fluidic communication with the manifold insert fluid channels, and a heat transfer surface for thermal communication with one or more electronic devices.

In accordance with one or more embodiments, a configurable, double sided, manifold micro-channel cold plate may comprise one or more of the following: a plurality of manifold micro-channel cold plate cells in fluidic communication with each other, each manifold micro-channel cold plate cell comprising: a manifold body including fluid channel network to permit flow of a fluid coolant through the manifold body; a manifold insert, configured for receipt in the modular body, each planar surface of the manifold insert including a plurality of manifold insert fluid channels; and a plurality of heat sinks configured for receipt in the modular body at planar surfaces of the manifold insert, the heat sinks including an impingement surface configured for fluidic communication with the manifold insert fluid channels, and a heat transfer surface for thermal communication with one or more electronic devices. The configurable, double sided, manifold micro-channel cold plate may also comprise a plate connector to establish a bond connection between the manifold micro-channel cold plate cells and electrical communication between the manifold micro-channel cold plate cells and the one or more electronic devices.

In accordance with one or more embodiments, a power electronics module may comprise one or more of the following: a configurable, double sided, manifold micro-channel cold plate including a plurality of manifold micro-channel cold plate cells in fluidic communication with each other, each manifold micro-channel cold plate cell comprising: a manifold body including fluid channel network to permit flow of a fluid coolant through the manifold body; a manifold insert, configured for receipt in the modular body, each planar surface of the manifold insert including a plurality of manifold insert fluid channels; and a plurality of heat sinks configured for receipt in the modular body at planar surfaces of the manifold insert, the heat sinks including an impingement surface configured for fluidic communication with the manifold insert fluid channels, and a heat transfer surface for thermal communication with one or more electronic devices. The power electronics module may also comprise a plurality of electronic devices configured for thermal communication with the heat sinks at both sides of the manifold micro-channel cold plate; and a plate connector to establish a bond connection between the manifold micro-channel cold plate cells and electrical communication between the manifold micro-channel cold plate cells and the electronic devices.

The bond connection between an inlet/outlet manifold and a manifold body includes a thermally conductive metal plate member having a through hole and optional plug at opposing ends. Additional body manifolds can be attached with additional aluminum plates either in a series or parallel arrangement. The metal plate member can be provided with one or more power connectors and/or one or more signal connectors to be in electrical communication with one or more power electronic modules/electronic devices to be thermally managed by the MMC cold plate. Additionally or alternatively, one or more power connectors and/or one or more signal connectors may be arranged in side walls of the manifold body of a unit cell.

The configurable, double sided, MMC cold plate provides numerous technical advantages. For example, the MMC cold plate in accordance with one or more embodiments has a single, unitary compact design that is lightweight when compared to contemporary designs.

The MMC cold plate, having one or more bond connections at contact/bond interfaces, does not require the use of mechanical seals such as O-rings at the contact/bond interface between the heat sinks and the manifold body. The use of bond connections also results in the MMC cold plate not requiring mechanical fasteners such as bolts to connect the heat sinks to the manifold body. The use of bond connections also results in the MMC cold plate not requiring metal stiffeners on the side the heat sinks to avoid bowing due to internal pressure. The use of bond connections also results in the MMC cold plate not requiring flanges to connect unit cells to each other. Because the MMC cold plate does not require O-rings and/or bolts, the base of the heat sink has a reduced area.

The bond connections between unit cells and/or I/O manifolds also facilitates electrical current connection between power electronic modules/electronic devices arranged at opposing sides of the MMC cold plate.

The MMC cold plate does not require a plurality of connecting channels between the coolant channels of each manifold body, which results in easier fabrication, lower overall fabrication costs, and a reduction in width of the manifold body.

The MMC cold plate uses a single, unitary manifold insert design that is enclosed at both planar surfaces by heat sinks, which provides for a more compact, lightweight design.

The overall reduction in components and parts for the MMC cold plate realizes a reduction in size/volume, fabrication costs, overall weight.

BRIEF DESCRIPTION OF THE SEVERAL VIEWS OF THE DRAWINGS

The various advantages of the embodiments of the present invention will become apparent to one skilled in the art by reading the following specification and appended claims, and by referencing the following drawings, in which:

FIGS. 3A to 3C illustrates a fluid flow path within the MMC cold plate unit cell of FIG. 2.

DETAILED DESCRIPTION

Figure 1:
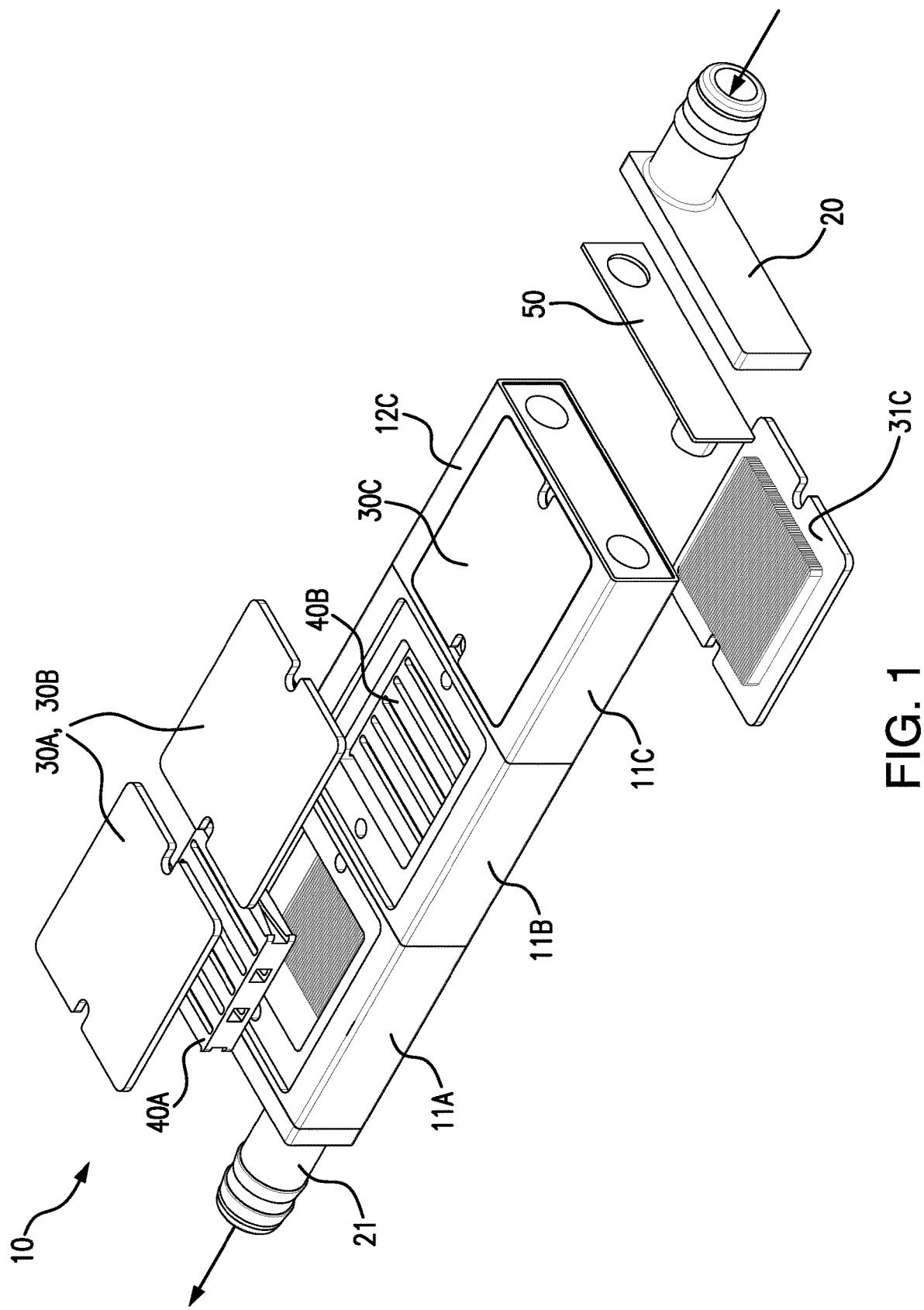
FIG. 1 illustrates an exploded view of an example configurable MMC cold plate, in accordance with one or more embodiments shown and described herein.
Figure 9:
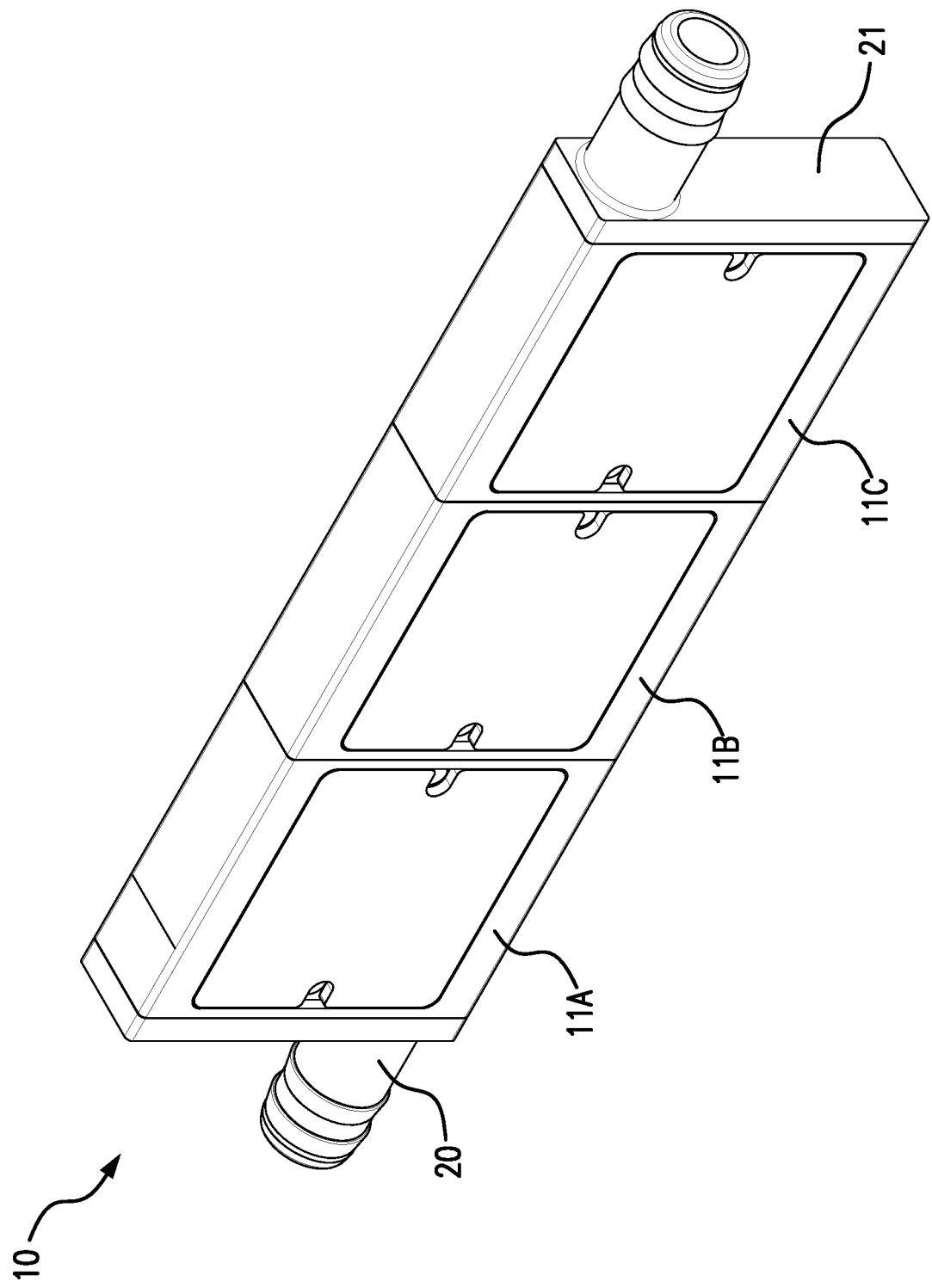
FIG. 9 illustrates an isometric view of the MMC cold plate of FIG. 1.

As illustrated in FIGS. 1 and 9, a configurable, double sided, MMC cold plate 10 includes a modular structural assembly comprising one or more unit cells 11A, 11B, 11C interconnected to each other via bond connection. A fluid manifold inlet 20 is fluidically connected to a unit cell 11C at one end of the MMC cold plate 10, while a fluid manifold outlet 21 is fluidically connected to a unit cell 11A at an opposite end of the MMC cold plate 10.

Figure 2:
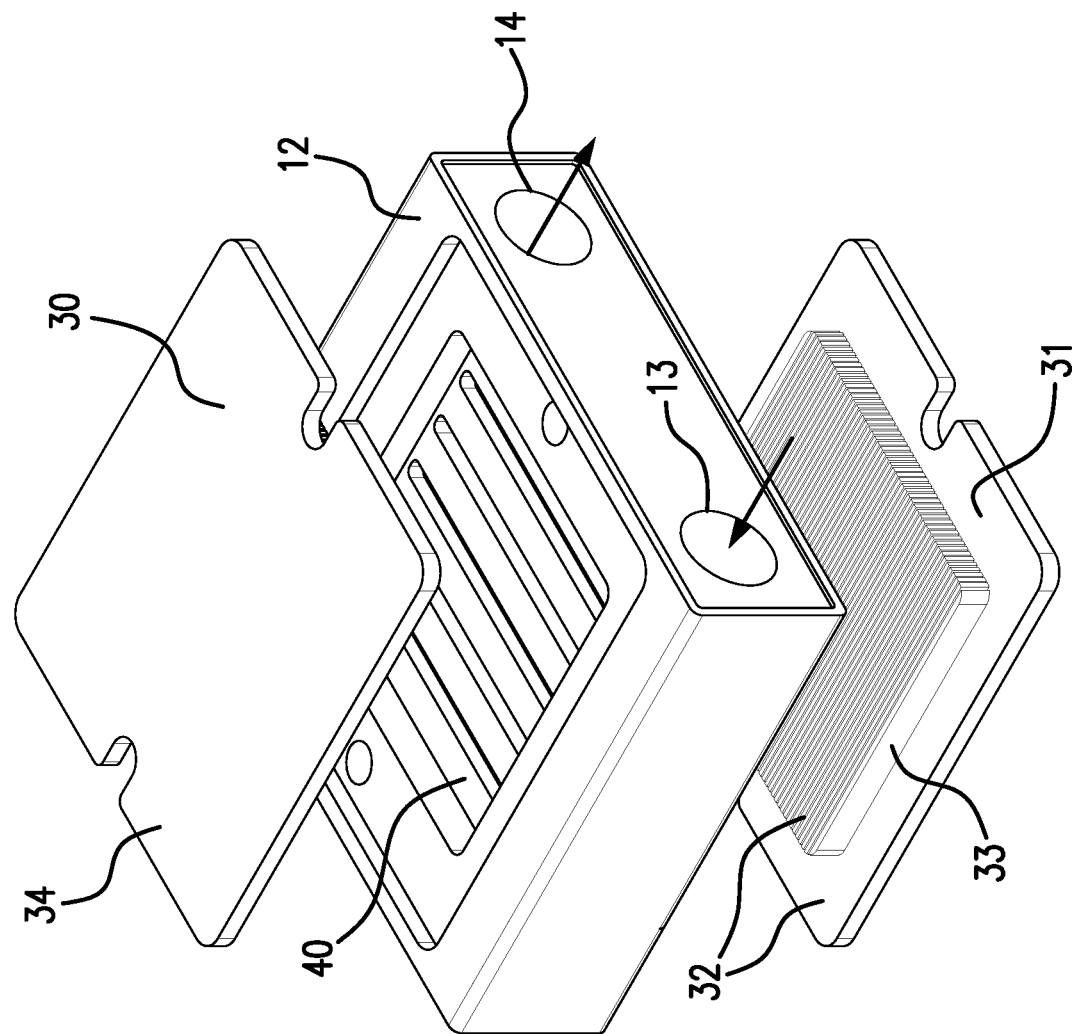
FIG. 2 illustrates an exploded view of view of a unit cell of the configurable MMC cold plate of FIG. 1.

As illustrated in FIG. 2, each unit cell 11A, 11B, 11C of the MMC cold plate 10 comprises a manifold body 12, a first thermally conductive heat sink 30 and a second thermally conductive heat sink 31 at respective planar sides of the manifold body 12, a manifold insert 40 removeably received in the manifold body 12 and enclosed therein by the heat sinks 30, 31, and a thermally conductive metal manifold plate member 50 to facilitate a bond connection between unit cells 11A, 11B, 11C and also between unit cells 11A, 11C and the I/O fluid manifolds 20, 21. Although the illustrated embodiments show an MMC cold plate 10 having three unit cells, embodiments are not limited therewith, and thus, this disclosure contemplates a MMC cold plate 10 configuration having any number of unit cells that falls within the spirit and scope of the principles of this disclosure set forth herein.

Figure 4C:
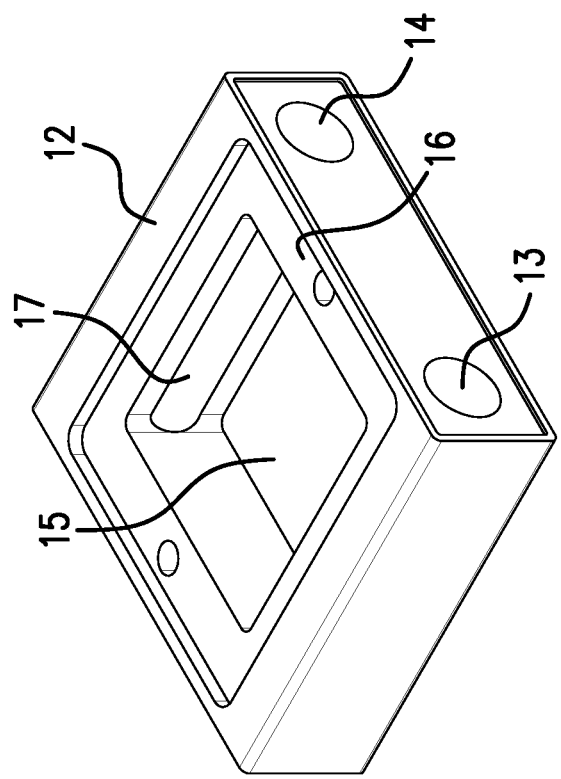
FIGS. 4A to 4C illustrates isometric views of the MMC cold plate unit cell, a body manifold of the MMC cold plate unit cell, and a front view of the MMC cold plate unit cell of FIG. 2.
Figure 4A:
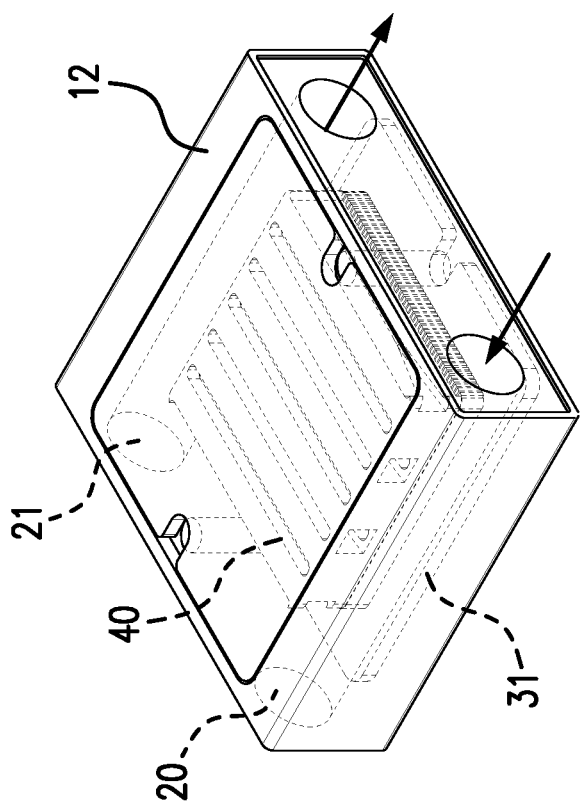
Figure 4B:
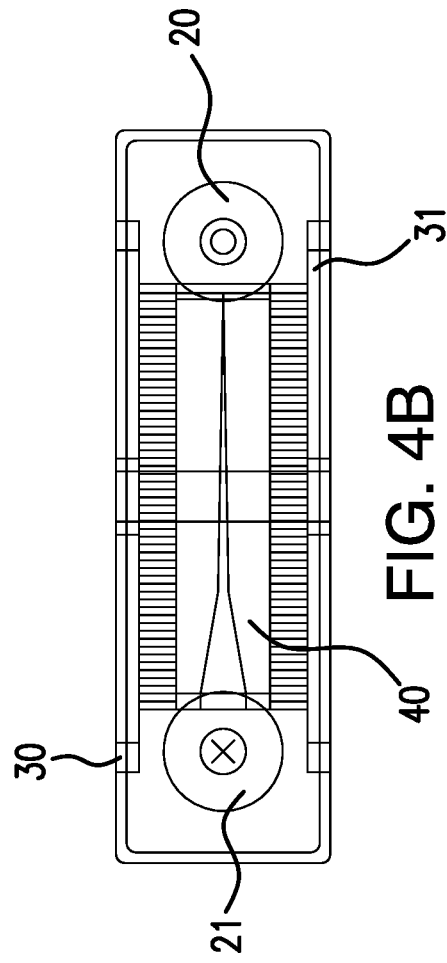

FIG. 4A illustrates the manifold insert 40 and the lower heat sink 31 within a transparent body manifold body 12, FIG. 4B illustrates the unit cell 11, and FIG. 4C illustrates the manifold body 12.

As illustrated in FIG. 4C, fluid channels 13, 14 extend through opposite sides of the manifold body 12 to facilitate flow of the coolant fluid through the MMC cold plate cell. The manifold body 12 defines a plurality of recesses that include a distribution recess 15 to removeably receive a single manifold insert 40, and planar recesses 16 provided on planar sides of the manifold body 12 to receive a corresponding heat sink 30, 31 to be bond connected thereto. The manifold body 12 also includes side openings 17 configured for fluidic communication with the distribution recess 15 and the fluid channels 13, 14. The manifold body 12 may be composed of a polymer having good mechanical properties and high thermal resistivity such as, for example, polyketone, polyphenylene sulfide (PPS), and the like. Embodiments, however, are not limited therewith, and thus, this disclosure contemplates having a manifold body composed of any material polymer having good mechanical properties and high thermal resistivity that falls within the spirit and scope of the principles of this disclosure set forth herein. For example, the manifold body 12 may be composed of a metal or metal alloy such as aluminum, steel, and the like. In such an embodiment, the heat sinks 20, 21 may be connected via any direct metal-metal bond technique.

Coolant fluid is to enter the manifold body 12 from the fluid channel 13 to flow through a proximate side opening 17 into the manifold insert 40 and then contact the heat sinks 30, 31 to remove heat therefrom. The coolant fluid is then collected by the manifold insert 40 and flows into the outlet fluid channel 14 through a proximate side opening 17. Although the illustrated embodiment(s) of each manifold body is generally rectangular in cross-section, embodiments are not limited therewith, and thus, this disclosure contemplates having a manifold body encompassing any other geometric structural configuration that falls within the spirit and scope of the principles of this disclosure set forth herein.

As illustrated in FIGS. 2, 3A to 3C and 4A to 4C, each heat sink 30, 31 comprises an impingement surface 32 and a heat transfer surface 34. The impingement surface 32, having one or more array of fins or an impingement block 33, is configured for fluidic communication with the manifold insert 40. The heat transfer surface 34 is configured for thermal communication with one or more heat generating devices such as, for example, power modules/electronic devices. The heat sink 30, 31 may be composed of a metal or metal alloy exhibiting high thermal conductivity, such as, for example, aluminum or steel. Embodiments, however, are not limited therewith, and thus, this disclosure contemplates the heat sinks having any material composition that falls within the spirit and scope of the principles of this disclosure set forth herein.

Each MMC cold plate 10 is configured to actively and/or passively alter the mass flow rate of coolant fluid flowing along a fluid flow path formed within each unit cell 11A, 11B, 11C, which may facilitate uniform thermal management and/or targeted heat transfer from the heat generating devices to the coolant fluid. In that way, heat flux from the heat generating devices is removed and the overall operating life of the heat generating devices is increased.

Each manifold insert 40 is configured for removeable receipt into the distribution recess 15 of the manifold body 12 to establish fluidic communication with the heat sinks 30, 31. An interior region of the manifold insert 40 has one or more inlet branch channels 41 and one or more outlet branch channels 42. The one or more inlet branch channels 41 are in fluidic communication with the side openings 17 of the manifold body 12 when the manifold insert 40 is positioned in the distribution recess 15 of the manifold body 12, thereby defining a portion of a fluid flow path 60. The one or more outlet branch channels 42 are in fluidic communication with the opposite side opening 17 of the manifold body 12 when the manifold insert 40 is positioned in the distribution recess 15 of the manifold body 12, thereby defining another portion of the fluid flow path 60.

The impingement surface 32 of each heat sink 30, 31 is configured for fluidic communication with the inlet branch channels 41 and the outlet branch channels 42 of the manifold insert 40. As illustrated in FIGS. 3A to 3C, in an embodiment when the impingement surface 32 comprises an array of fins 33, heat is to be transferred to the coolant fluid as jets of the coolant fluid impinge the impingement surface 32. By selectively positioning the heat sinks 30, 31 having arrays of fins or impingement blocks 33 on opposite sides of the manifold insert 40, each MMC cold plate 10 may be configurable to provide targeted thermal management to various arrangements of heat generating devices.

An exterior region of the manifold insert 40 has a slot surface 43 positioned in the distribution recess 15 of the manifold body 12 proximate the impingement surface 32 of a corresponding one of the heat sinks 30, 31. The slot surface 43 comprises one or more collecting slots 44 extending parallel with each other for fluidic communication with the one or more outlet branch channels 42 to form additional throughput portions of the manifold insert 40 such that coolant fluid may pass through the collecting slots 44. Although the illustrated embodiment(s) of the slot surface 43 includes uniformly-shaped and sized collecting slots 44, embodiments are not limited therewith, and thus, the collecting slots 44 may have uniform or non-uniform shapes and cross-sectional areas and may take a variety of sizes and shapes to collect coolant fluid after it impinges the heat sink 30, 31 and transfer heat from the heat transfer plate 30, 31.

As illustrated in FIG. 3C, the manifold insert 40 may comprise an uneven or unbalanced number or ratio of inlet branch channels 41 (e.g., four) and outlet branch channels 42 (e.g., three). Embodiments, however, are not limited therewith, and thus, this disclosure contemplates any number of inlet branch channels 41 and outlet branch channels 42 that fall within the spirit and scope of the principles of this disclosure set forth herein. For example, the manifold insert 40 may comprise an even number or ratio of inlet branch channels 41 and outlet branch channels 42.

In one or more embodiments in which there are a greater number of inlet branch channels 41 than outlet branch channels 42, the outlet branch channels 42 may have an individual width that is greater than the width of the inlet branch channels 41. To facilitate and/or maintain even or balanced coolant fluid flow through the manifold insert 40, the overall combined widths of the inlet branch channels 41 may be substantially equal to the overall combined widths of the outlet branch channels 42.

In one or more embodiments in which there are the same number of inlet branch channels 41 and outlet branch channels 42, the outlet branch channels 42 may have an individual width that is substantially equal to the width of the inlet branch channels 41. In that way, even or balanced coolant fluid flow through the manifold insert 40 is facilitated and/or maintained.

In one or more embodiments, one or more of the inlet branch channels 41 may comprise one or more tapered portions to balance the flow of the coolant fluid. Alternatively or additionally, one or more of the outlet branch channels 42 may comprise one or more tapered portions to balance the flow of the coolant fluid.

In operation, a coolant fluid is to flow into the manifold body 12 to be distributed by the manifold insert 40 into the heat sinks 30, 31. Then, the coolant fluid is again collected by the manifold insert 40 into the manifold body 12 and flows out of the manifold body 12. The manifold insert 40 is configured to distribute the coolant fluid into the heat sinks 30, 31 on both top/upper and bottom/lower sides of the manifold insert 40.

Figure 5:
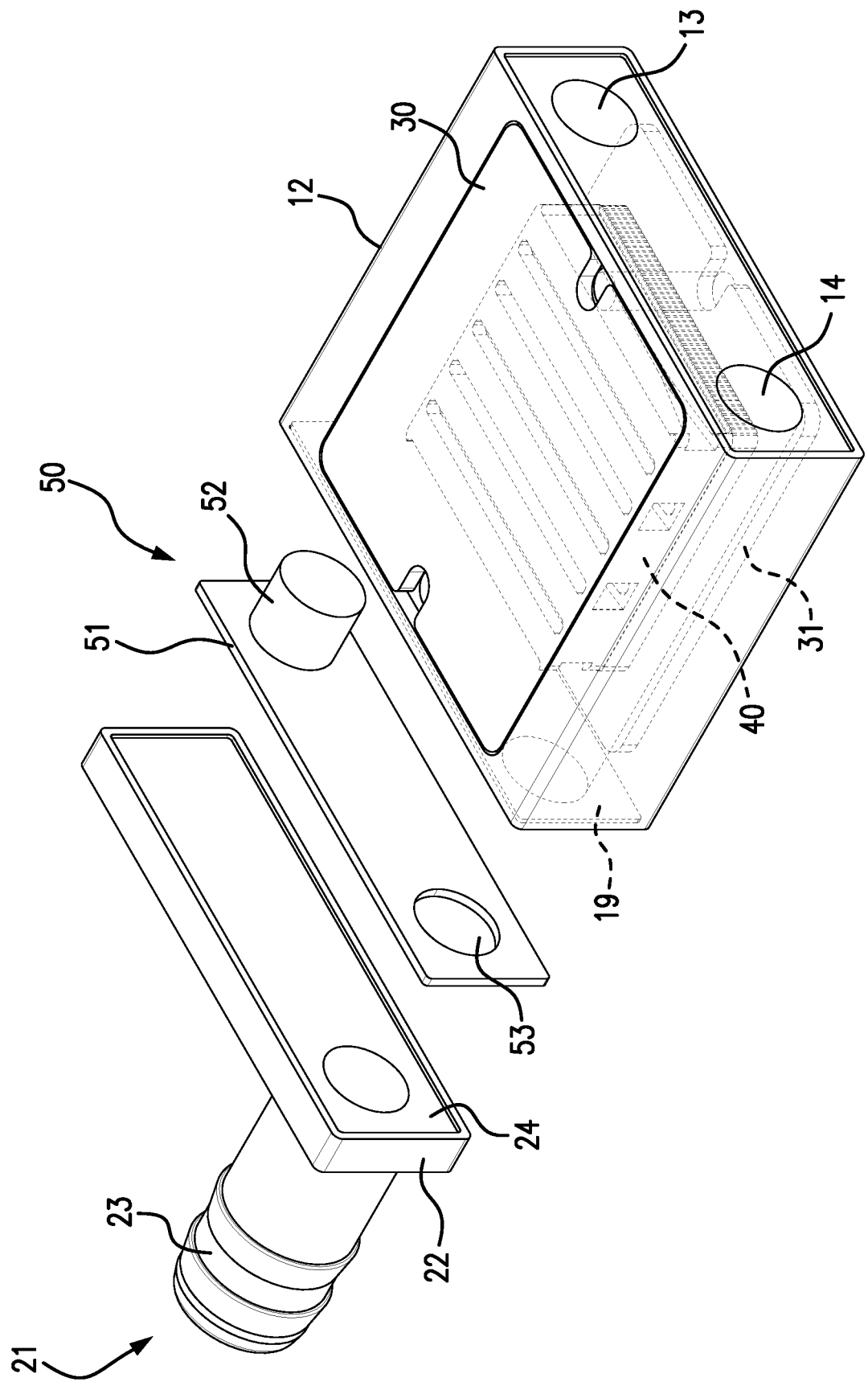
FIG. 5 illustrates a connection between an inlet/outlet manifold and a body manifold of the configurable MMC cold plate of FIG. 1.

As illustrated in FIG. 5, the manifold fluid inlet 20 and the manifold fluid outlet 21 respectively comprise an inlet/outlet (I/O) body 22 having a longitudinally extending I/O tube defining a channel 23 from a front planar surface thereof to facilitate flow of a coolant fluid therethrough (manifold fluid inlet 20) or therefrom (manifold fluid outlet 21). The I/O channel 23 has a barbed fitting to facilitate fluidic communication with a fluid inlet source (manifold fluid inlet 20) or a fluid outlet source (manifold fluid outlet 21). A plate recess or cavity 24 is provided at a rear planar surface of the I/O body 22 and sized to receive by interference fit, for example, the plate member 50.

The plate member 50 includes a plate body 51 composed of a metal exhibiting high thermally conductivity such as, for example, aluminum. The plate body 51 may have a shape that corresponds to the shape or cross-section of the plate recesses 19, 24 for receipt at a bonding interface. Arranged at one end of the plate body 51 is a plug member 52 that extends from the surface of the plate body 51 in a direction perpendicular to the surface. At an opposite end of the plate body 51 is a through hole or opening 53. The respective diameter of the plug member 52 and the through hole 53 may be substantially the same as the diameter of the I/O channel 23.

Figure 7A:
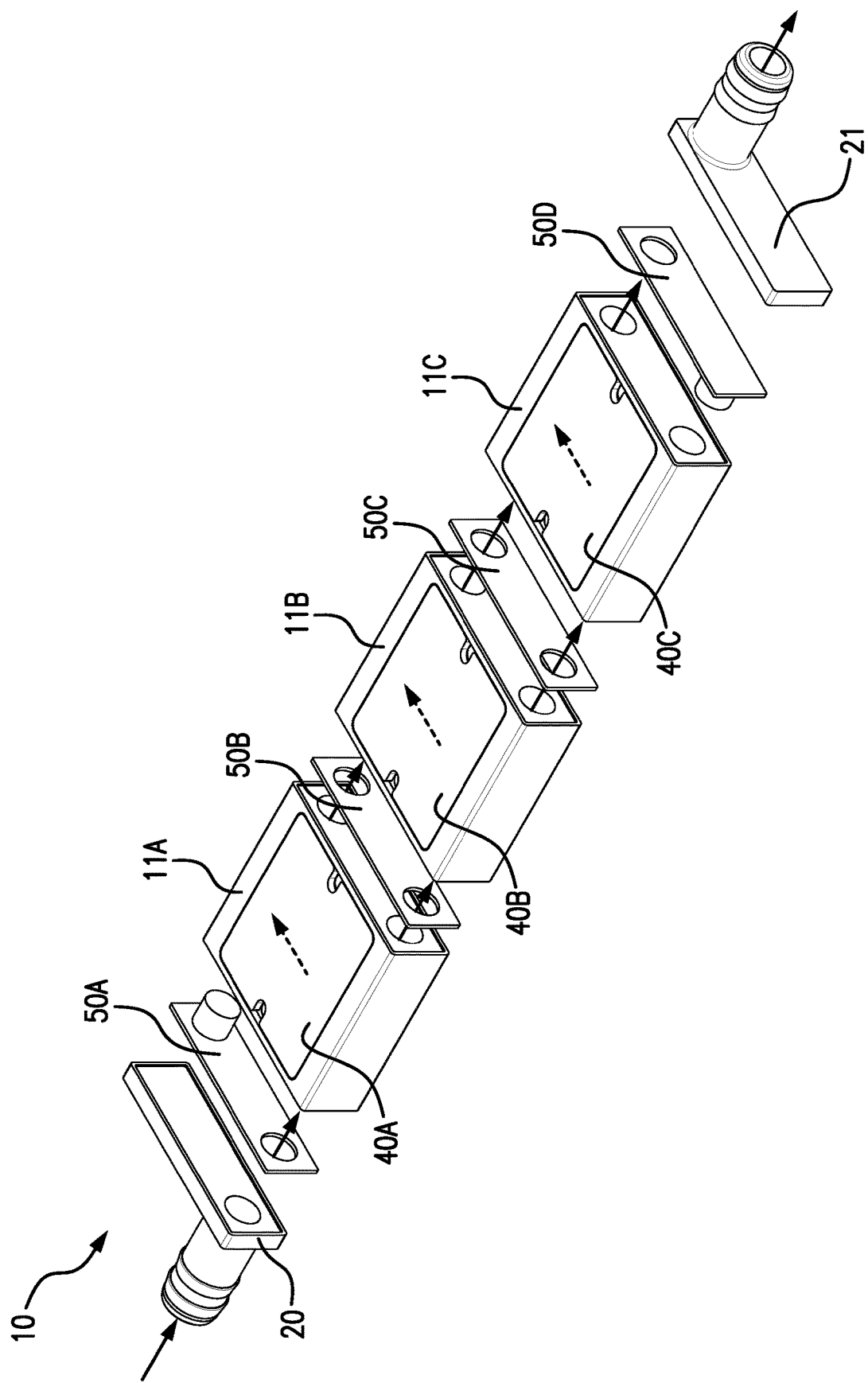
FIGS. 7A and 7B illustrate a connection between a plurality of unit cell MMC cold plates in parallel, and an orientation of the manifold inserts.
Figure 7B:
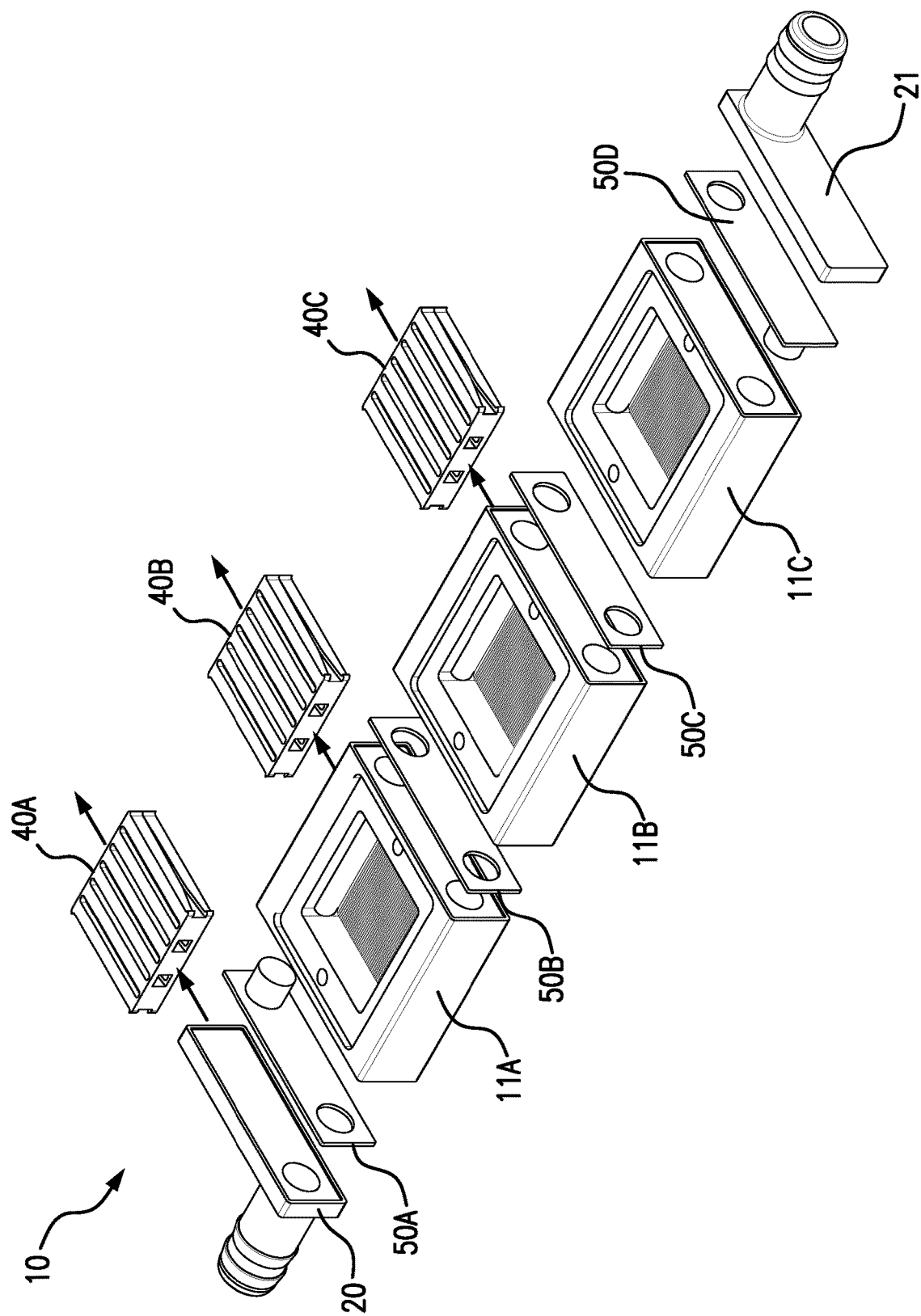

As illustrated in FIGS. 7A and 7B, in one or more embodiments, a second plate body 50B, 50C may comprise a through hole at both ends thereof.

Each plate recess 19, 24 may have a depth that is less than one-half the thickness of the plate body 51 to facilitate a bond connection between an I/O manifold 20, 21 and the manifold body 12. Although the illustrated embodiment(s) provides for plate recesses 19, 24, embodiments are not limited therewith. This disclosure contemplates any structural arrangement that falls within the spirit and scope of the principles of this disclosure set forth herein. For example, the manifold body 12 and the I/O manifold 20, 21 may respectively have a flat surface at the bonding interface instead of a recess.

In operation, the coolant fluid will flow through the I/O channel 23 of the inlet manifold 20 and into the manifold body 12 through the through hole 53 of the plate member 50. The other end of the plate member 50 is configured to prevent flow of the coolant fluid out of that port due to the presence of the plug member 52 protruding into the port. Although the illustrated embodiment(s) provides for a plate member 50 having a plug member 53 to prevent coolant fluid flow at a port, embodiments are not limited therewith. This disclosure contemplates any structural arrangement that falls within the spirit and scope of the principles of this disclosure set forth herein. For example, the planar surface of the plate member 50 can be flat and still provide the effect of preventing flow of the coolant fluid out of a specific port.

To fluidically seal the MMC cold plate 10, the I/O manifolds 20, 21, the plate member 50, and the manifold body 12 are connected at each bond interface via a direct metal-plastic bond connection technique. One or more connection or bond interfaces between the heat sinks 30, 31 and the manifold body 12 are also fluidically sealed via a direct metal-plastic bond connection technique, thereby dispensing the need for mechanical seals such as O-rings and the like or mechanical fasteners such as bolts and stiffeners. In the direct metal-plastic bonding process, the bonding surface of the heat sinks 30, 31 is treated via an etching process to provide an extremely structured bonding surface comprising a plurality of undercuts and cavernous contours.

Next, the bonding surface of the heat sinks 30, 31 is heated and the manifold body 12 is pressed onto the hot bonding surface of the heat sinks 30, 31, and then cooled to obtain the bond connection. Such heating may be conducted via induction heating or conduction heating (e.g., hot plate), or other heating methods that that fall within the spirit and scope of the principles of this disclosure set forth herein. Since the bonding surface is structured having contours, caves and undercuts, the liquid plastic of the manifold body 12 flows into the microcavities and undercuts and fills the microcavities. The structures in the sub-micrometer range are completely wetted with plastic without air pockets or voids in the bond connection. The result is a high-strength bond connection between the manifold body 12 and the heat sinks 30, 31 that also forms a fluidic seal at the one or more bond interfaces to prevent coolant fluid leaks. In this way, the high-strength bond connection provides a cost-effective solution that obviates the need for sealing elements such as O-rings, or mechanical fasteners such as bolts or screws, and is also not a source of corrosion.

The bonding surface of the heat sinks 30, 31 may be heated to a predetermined temperature such as, for example, 250° C. or 320° C. Embodiments, however, are not limited therewith, and thus, this disclosure contemplates a predetermined temperature that depends upon the material composition of the manifold body 12.

Figure 6A:
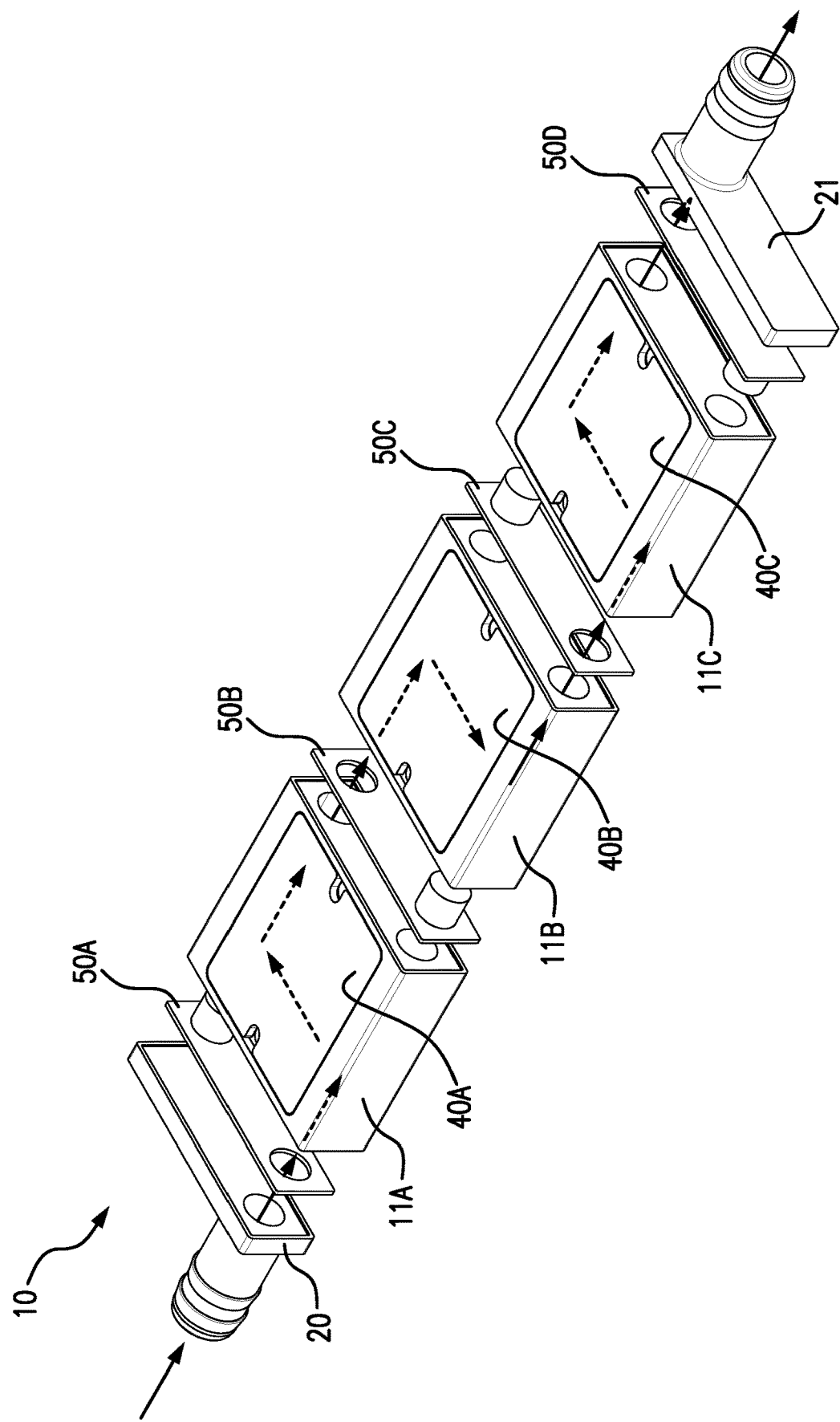
FIGS. 6A and 6B illustrate a connection between a plurality of unit cell MMC cold plates in series, and an orientation of the manifold inserts, in accordance with one or more embodiments shown and described herein.
Figure 6B:
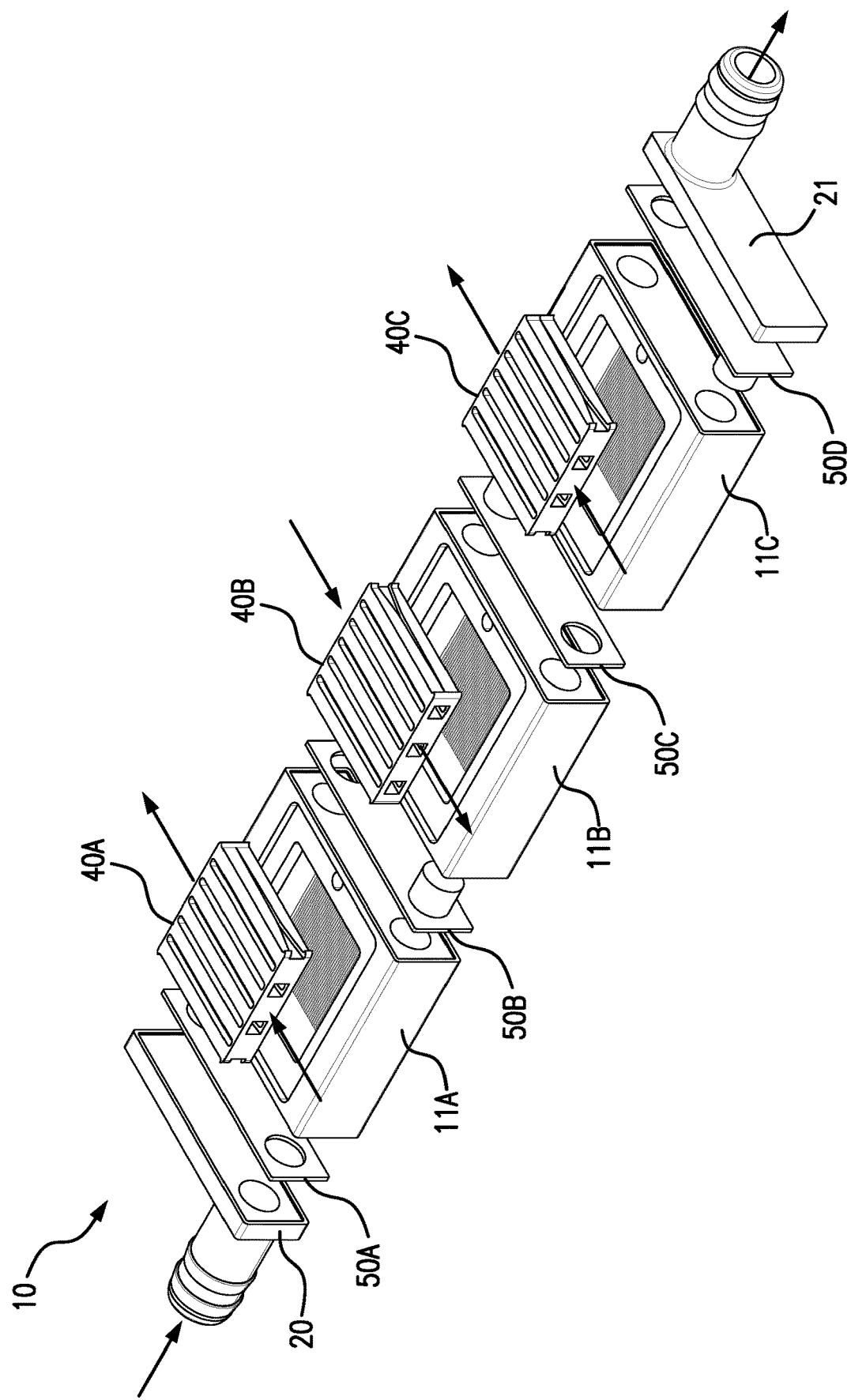

As illustrated in FIGS. 6A and 6B, the MMC cold plate cells 11A, 11B, 11C may be interconnected similarly via metal-plastic direct bonding at one or more bond interfaces to establish fluidic communication with each other in a manner such that a coolant fluid flows through each MMC cold plate cell 11A, 11B, 11C in series.

At the inlet region, a first plate member 50A is arranged between the inlet manifold 20 and a first MMC cold plate cell 11A. The first plate member 50A has a through hole 53 that is aligned with the fluid channel 13A of the first MMC cold plate cell 11A and the channel 23 of the inlet manifold 20 to facilitate flow of a coolant fluid through the port of the fluid channel 13A and into the first MMC cold plate cell 11A. The plug member 52 of the first plate member 50A protrudes into the fluid channel 14A of the first MMC cold plate cell 11A to prevent coolant fluid flow through the port of the fluid channel 14A. As illustrated in FIG. 6B, the manifold insert 40A is oriented in a manner that places the inlet branch channels 41A of the manifold insert 40A in series with the fluid channel 13A, and the outlet branch channels 42A in series with the fluid channel 14A. A direct bonding process, as described herein, is conducted to establish a connection between the inlet manifold 20 and the first MMC cold plate cell 11A via the first plate member 50A by etching and heating the first plate member 50A, and then pressing the inlet manifold 20 and the first MMC cold plate cell 11A against the heated first plate member 50A.

Downstream of the inlet region, a second plate member 50B is arranged between the first MMC cold plate cell 11A and the second MMC cold plate cell 11B to establish a high-strength bond connection between the first MMC cold plate cell 11A and the second MMC cold plate cell 11B. The through hole 53 of the second plate member 50B is aligned with the channel 14A of the first MMC cold plate cell 11A and the fluid channel 14B of the second MMC cold plate cell 11B to facilitate flow of the coolant fluid from the first MMC cold plate cell 11A to the second MMC cold plate cell 11B. The plug member 52 of the second plate member 50B protrudes into the fluid channel 13B of the second MMC cold plate cell 11B to prevent coolant fluid flow through the port of the second MMC cold plate cell 11B. The manifold insert 40B is oriented in a manner that places the inlet branch channels 41B of the manifold insert 40B in series with the fluid channel 14B, and the outlet branch channels 42B in series with the fluid channel 13B. A direct bonding process, as described herein, is conducted to establish a connection between the first MMC cold plate cell 11A and the second MMC cold plate cell 11B via the second plate member 50B by etching and heating the second plate member 50B, and then pressing the first MMC cold plate cell 11A and the second MMC cold plate cell 11B against the heated second plate member 50B.

Further downstream of the inlet region, a third plate member 50C is arranged between the second MMC cold plate cell 11B and the third MMC cold plate cell 11C to establish a high-strength bond connection between the second MMC cold plate cell 11B and the third MMC cold plate cell 11C. The third plate member 50C has a through hole 53 that is aligned with the fluid channel 13B of the second MMC cold plate cell 11B and the fluid channel 13C of the third MMC cold plate cell 11C to facilitate flow of a coolant fluid from the port of the fluid channel 13B and into the third MMC cold plate cell 11C. The plug member 52 of the third plate member 50C protrudes into the fluid channel 14C of the third MMC cold plate cell 11C to prevent coolant fluid flow through the port of the third MMC cold plate cell 11C. The manifold insert 40C is oriented in a manner that places the inlet branch channels 41C of the manifold insert 40C in series with the fluid channel 13C, and the outlet branch channels 42C in series with the fluid channel 14C. A direct bonding process, as described herein, is conducted to establish a connection between the second MMC cold plate cell 11B and the third MMC cold plate cell 11C via the third plate member 50C by etching and heating the third plate member 50C, and then pressing the second MMC cold plate cell 11B and the third MMC cold plate cell 11C against the heated third plate member 50C.

At the outlet region, a fourth plate member 50D is arranged between the outlet manifold 21 and the third MMC cold plate cell 11C. The fourth plate member 50D has a through hole 53 that is aligned with the fluid channel 14C of the third MMC cold plate cell 11C and the channel 23 of the outlet manifold 21 to facilitate flow of the coolant fluid through the port of the fluid channel 14C and from the third MMC cold plate cell 11C via the outlet manifold 21. The plug member 52 of the fourth plate member 50D protrudes into the fluid channel 13C of the third MMC cold plate cell 11C to prevent coolant fluid flow through the port of the fluid channel 13C. A direct bonding process, as described herein, is conducted to establish a connection between the third MMC cold plate cell 11C and the outlet manifold 21 via the fourth plate member 50D by etching and heating the fourth plate member 50D, and then pressing the third MMC cold plate cell 11C and the outlet manifold 21 against the heated fourth plate member 50D.

As illustrated in FIGS. 7A and 7B, in accordance with one or more embodiments, the MMC cold plate cells 11A, 11B, 11C may be interconnected similarly via metal-plastic direct bonding at one or more bond interfaces to establish fluidic communication with each other in a manner such that a coolant fluid flows through each MMC cold plate cell 11A, 11B, 11C in parallel. For example, the embodiment illustrated in FIGS. 6A and 6B can be modified by using a second plate member 50B and a third plate member 50C with a second through hole 53 in place of the plug 52, and reorienting the manifold insert 40B by 180°.

Figure 8:
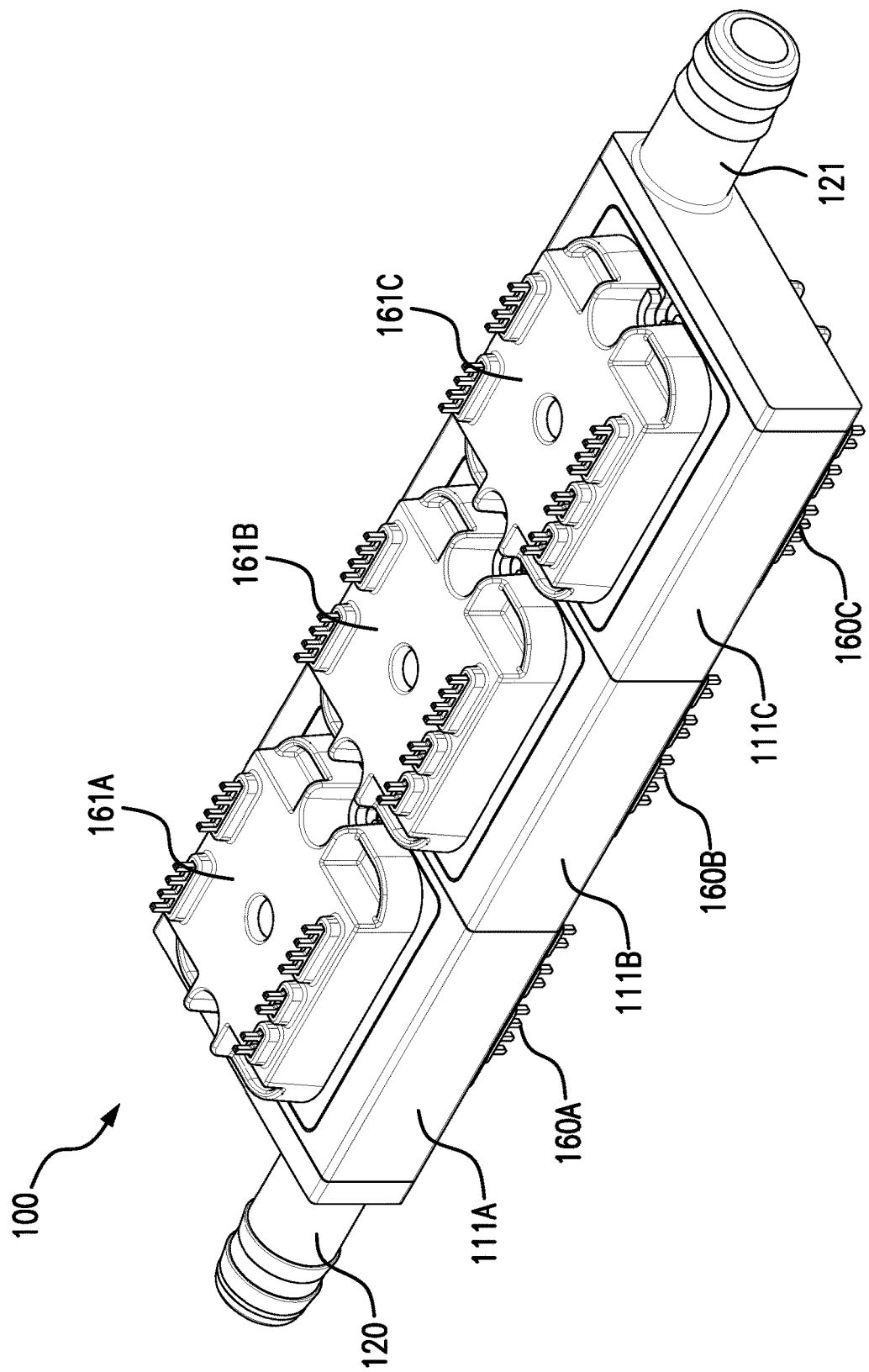
FIG. 8 illustrates a power electronics module, in accordance with one or more embodiments shown and described herein.
Figure 11:
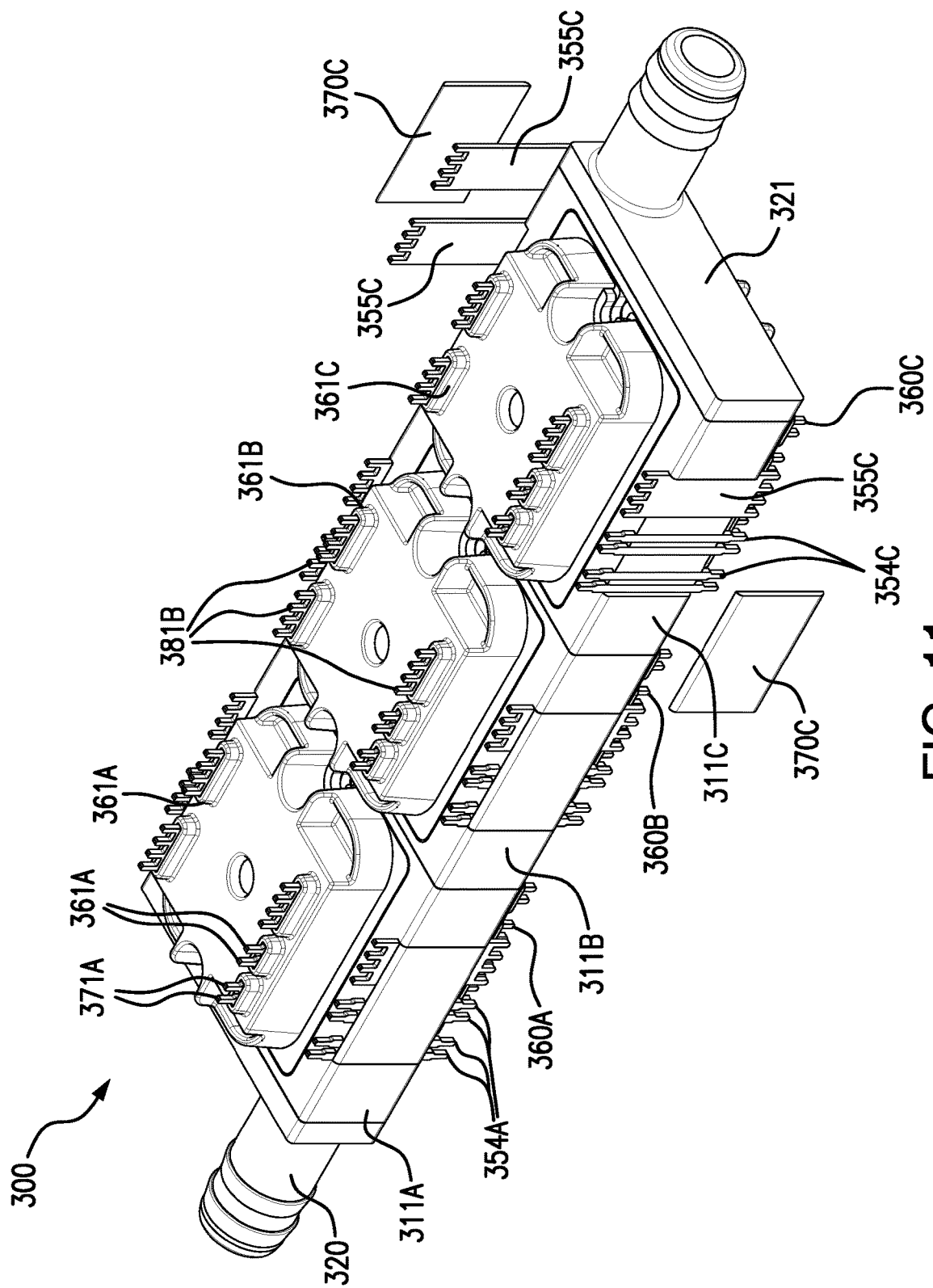
FIG. 11 illustrates a power electronics module, in accordance with one or more embodiments shown and described herein.

FIGS. 8 and 11 illustrate a power electronics module 100, in accordance with one or more embodiments. The power electronics module 100 may comprise the configurable, double sided MMC cold plate (as set forth, described, and/or illustrated herein) that comprises a plurality of MMC cold plate cells 111A, 111B, 111C in fluidic communication with each other, and a plurality of electronic devices that includes one or more first electronic devices 160A, 160B, 160C configured for thermal communication with each first heat sink 130A, 130B, 130C and one or more second electronic devices 161A, 161B, 161C configured for thermal communication with each second heat sink 131A, 131B, 131C. Accordingly, the single configurable, double sided MMC cold plate provides a compact, lightweight design to provide enhanced thermal management to six or more electronic devices and/or heat sources.

Figure 10:
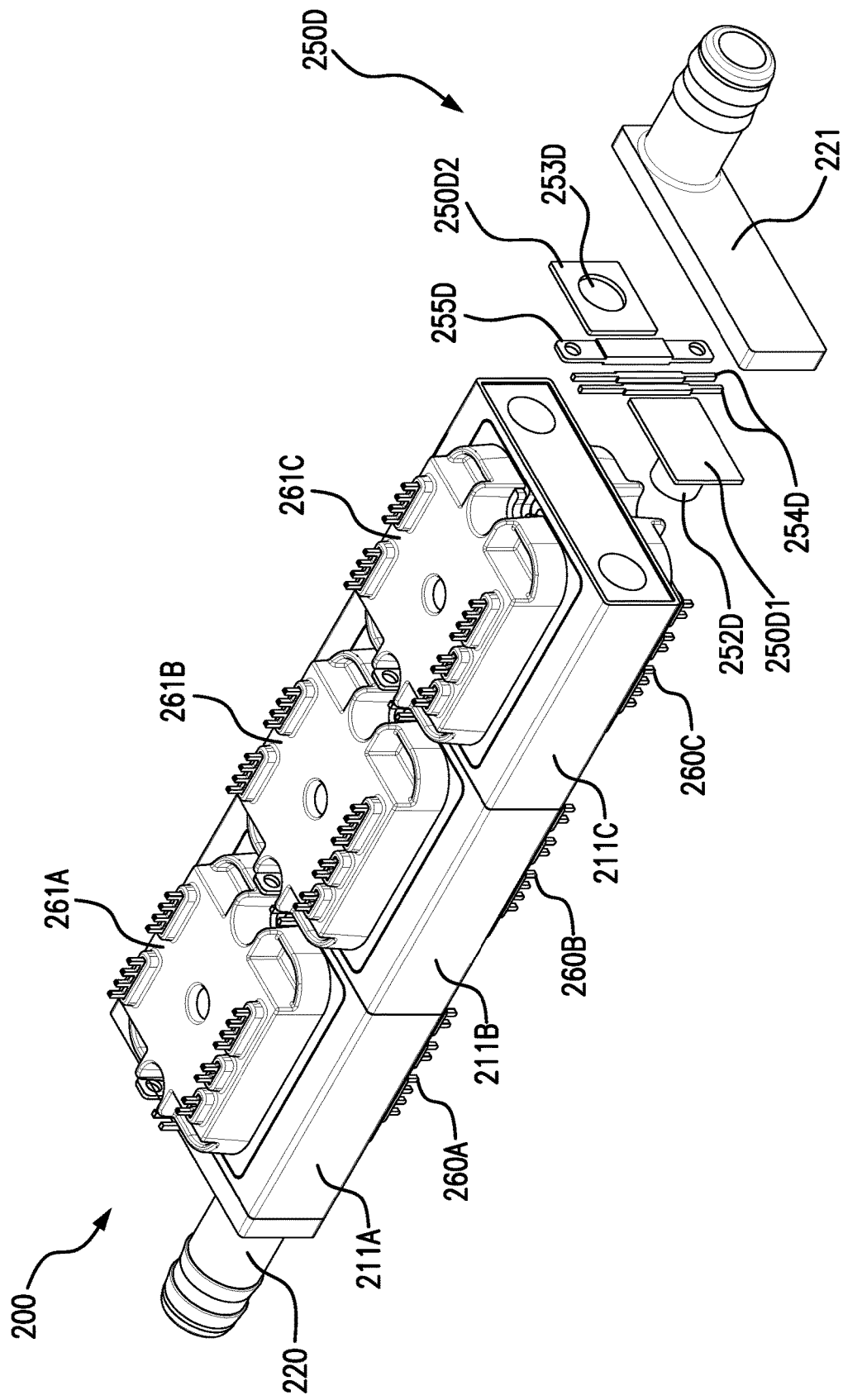
FIG. 10 illustrates a power electronics module, in accordance with one or more embodiments shown and described herein.

FIG. 10 illustrates a power electronics module 200, in accordance with one or more embodiments. The power electronics module 200 may comprise the configurable, double sided MMC cold plate (as set forth, described, and/or illustrated herein) that comprises a plurality of MMC cold plate cells 211A, 211B, 211C in fluidic communication with each other, and a plurality of electronic devices that includes one or more first electronic devices 260A, 260B, 260C configured for thermal communication with each first heat sink 230A, 230B, 230C and one or more second electronic devices 261A, 261B, 261C configured for thermal communication with each second heat sink 231A, 231B, 231C. A bond connection between components of the configurable, double sided MMC cold plate is achieved via a bifurcated thermally and electrically conductive metal plate member configuration that comprises a first plate member region 250A1-D1 and a second plate member region 250A2-D2. For example, at the bond interface between the third MMC cold plate cell 211C and the outlet manifold 221 is a plate member 250D comprising a first plate member region 250D1 and a second plate member region 250D2.

The first plate member region 250D1 comprises a plug member 252D (or optionally, a through hole) and one or more signal connectors 254D extending generally perpendicular from the first plate member region 250D1. The second plate member region 250D2 comprises a through hole 253D and one or more power connectors 255D extending generally perpendicular from the second plate member region 250D2. The signal connectors 254D and the power connector 255D are configured for electrical communication with a corresponding one of the electronic devices 260A, 260B, 260C, 261A, 261B.

Thus, the plate member 250D is configured to not only facilitate a bond connection between the MMC cold plate cells 211A, 211B, 211C and I/O manifolds 220, 221, but also serve as a signal connector and a power connector for the electronic devices 260A-C, 261A-C (or any other electrical components). The signal connectors 254A-D and the power connector 255A-D are embedded in plastic of the manifold body and/or I/O manifold to be electrically insulated from the regions of the plate member 250A-D that are in contact with the coolant fluid. Although the illustrated embodiments show a pair of signal connectors and a single power connector, embodiments are not limited therewith, and thus, this disclosure contemplates any number of signal connectors and power connector that falls within the spirit and scope of the principles of this disclosure set forth herein.

FIG. 11 illustrates a power electronics module 300, in accordance with one or more embodiments. The power electronics module 300 may comprise the configurable, double sided MMC cold plate (as set forth, described, and/or illustrated herein) that comprises a plurality of MMC cold plate cells 311A, 311B, 311C in fluidic communication with each other, and a plurality of electronic devices that includes one or more first electronic devices 360A, 360B, 360C configured for thermal communication with each first heat sink 330A, 330B, 330C and one or more second electronic devices 361A, 361B, 361C configured for thermal communication with each second heat sink 331A, 331B, 331C. Sidewalls of each manifold body is provided with grooves sized to receive one or more signal connectors 354A-D and one or more power connectors 355A-D which are to serve as a signal connector and a power connector for the electronic devices 360A-C, 361A-C (or any other electrical components). A cover 370A-C is bonded to the sidewall to provide electrical insulation for the signal connectors 354A-D and the power connectors 355A-D. The cover 370A-C may be composed of a polymer having good mechanical properties and high thermal resistivity such as, for example, polyketone, polyphenylene sulfide (PPS), and the like.

Although the one or more signal connectors and the one or more power connectors are illustrated as a metal configuration, embodiments are not limited thereto, and thus, this disclosure contemplates a design in which the signal connectors and the power connectors comprise flexible PCB-type of connectors.

The terms "coupled," "attached," or "connected" may be used herein to refer to any type of relationship, direct or indirect, between the components in question, and may apply to electrical, mechanical, fluid, optical, electromagnetic, electromechanical or other connections. In addition, the terms "first," "second," etc. are used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

What is claimed is:

1. A manifold micro-channel cold plate cell, comprising:
a manifold body including a fluid channel network to permit flow of a fluid coolant through the manifold body;
a manifold insert including a plurality of manifold insert fluid channels, configured for receipt in the manifold body, a first and second planar surface of the manifold insert each including one or more fluid slot portions of the plurality of manifold insert fluid channels, wherein the one or more fluid slot portions are in fluidic communication with one or more fluid branch channel portions of the plurality of manifold insert fluid channels located in an interior region of the manifold insert; and
a plurality of heat sinks configured for receipt in the manifold body at the first and second planar surfaces of the manifold insert, the heat sinks including an impingement surface configured for fluidic communication with the manifold insert fluid channels, and a heat transfer surface for thermal communication with one or more electronic devices.

2. The manifold micro-channel cold plate cell of claim 1, wherein the fluid channel network comprises:
a first fluid channel and a second fluid channel extending longitudinally through the manifold body; and
a first longitudinal opening configured for fluidic communication with the first fluid channel, and a second longitudinal opening configured for fluidic communication with the second fluid channel.

3. The manifold micro-channel cold plate cell of claim 2, wherein the plurality of heat sinks comprises:
a first heat sink configured for receipt in a first planar recess of the manifold body; and
a second heat sink configured for receipt in a second planar recess of the manifold body.

4. The manifold micro-channel cold plate cell of claim 3, wherein:
the impingement surface of the first heat sink is configured for fluidic communication with the manifold insert fluid channels at a first side of the manifold insert; and
the heat transfer surface of the first heat sink is configured for thermal communication with one or more electronic devices.

5. The manifold micro-channel cold plate cell of claim 3, wherein:
the impingement surface of the second heat sink is configured for fluidic communication with the manifold insert fluid channels at a second side of the manifold insert; and
the heat transfer surface of the second heat sink is configured for thermal communication with one or more electronic devices.

6. The manifold micro-channel cold plate cell of claim 3, further comprising:
one or more first direct bond connections to establish a sealed connection between the first heat sink and the manifold body at one or more bond interfaces at the first planar recess; and
one or more second direct bond connections to establish a sealed connection between the second heat sink and the manifold body at one or more bond interfaces at the second planar recess.

7. A configurable, double sided, manifold micro-channel cold plate, comprising:
a plurality of manifold micro-channel cold plate cells in fluidic communication with each other, each manifold micro-channel cold plate cell comprising:
a manifold body including a fluid channel network to permit flow of a fluid coolant through the manifold body;
a manifold insert including a plurality of manifold insert fluid channels, configured for receipt in the manifold body, a first and second planar surface of the manifold insert each including one or more fluid slot portions of the plurality of manifold insert fluid channels, wherein the one or more fluid slot portions are in fluidic communication with one or more fluid branch channel portions of the plurality of manifold insert fluid channels located in an interior region of the manifold insert; and
a plurality of heat sinks configured for receipt in the manifold body at the first and second planar surfaces of the manifold insert, the heat sinks including an impingement surface configured for fluidic communication with the manifold insert fluid channels, and a heat transfer surface for thermal communication with one or more electronic devices; and
a plate connector to establish a bond connection between the manifold micro-channel cold plate cells and electrical communication between the manifold micro-channel cold plate cells and the one or more electronic devices.

8. The manifold micro-channel cold plate of claim 7, wherein the fluid channel network comprises:
a first fluid channel and a second fluid channel extending longitudinally through the manifold body; and
a first longitudinal opening configured for fluidic communication with the first fluid channel, and a second longitudinal opening configured for fluidic communication with the second fluid channel.

9. The manifold micro-channel cold plate of claim 8, wherein the plurality of heat sinks comprises:
a first heat sink configured for receipt in a first planar recess of the manifold body; and
a second heat sink configured for receipt in a second planar recess of the manifold body.

10. The manifold micro-channel cold plate of claim 9, wherein:
the impingement surface of the first heat sink is configured for fluidic communication with the manifold insert fluid channels at a first side of the manifold insert; and
the heat transfer surface of the first heat sink is configured for thermal communication with the one or more electronic devices.

11. The manifold micro-channel cold plate of claim 9, wherein:
the impingement surface of the second heat sink is configured for fluidic communication with the manifold insert fluid channels at a second side of the manifold insert; and
the heat transfer surface of the second heat sink is configured for thermal communication with the one or more electronic devices.

12. The manifold micro-channel cold plate of claim 9, further comprising:
one or more first direct bond connections to establish a sealed connection between the first heat sink and the manifold body at one or more bond interfaces at the first planar recess; and one or more second direct bond connections to establish a sealed connection between the second heat sink and the manifold body at one or more bond interfaces at the second planar recess.

13. The manifold micro-channel cold plate of claim 7, wherein the coolant fluid flows through the manifold micro-channel cold plate in series via the plate connector and an orientation of each manifold insert in the manifold body.

14. The manifold micro-channel cold plate of claim 7, wherein the coolant fluid flows through the manifold micro-channel cold plate in parallel via the plate connector and an orientation of each manifold insert in the manifold body.

15. A power electronics module, comprising:
a configurable, double sided, manifold micro-channel cold plate including a plurality of manifold micro-channel cold plate cells in fluidic communication with each other, each manifold micro-channel cold plate cell comprising:
a manifold body including a fluid channel network to permit flow of a fluid coolant through the manifold body;
a manifold insert including a plurality of manifold insert fluid channels, configured for receipt in the manifold body, a first and second planar surface of the manifold insert each including one or more fluid slot portions of the plurality of manifold insert fluid channels, wherein the one or more fluid slot portions are in fluidic communication with one or more fluid branch channel portions of the plurality of manifold insert fluid channels located in an interior region of the manifold insert; and
a plurality of heat sinks configured for receipt in the manifold body at the first and second planar surfaces of the manifold insert, the heat sinks including an impingement surface configured for fluidic communication with the manifold insert fluid channels, and a heat transfer surface for thermal communication with one or more electronic devices;
a plurality of electronic devices configured for thermal communication with the heat sinks at both sides of the manifold micro-channel cold plate; and
a plate connector to establish a bond connection between the manifold micro-channel cold plate cells and electrical communication between the manifold micro-channel cold plate cells and the electronic devices.

16. The power electronics module of claim 15, wherein the fluid channel network comprises:
a first fluid channel and a second fluid channel extending longitudinally through the manifold body; and
a first longitudinal opening configured for fluidic communication with the first fluid channel, and a second longitudinal opening configured for fluidic communication with the second fluid channel.

17. The power electronics module of claim 16, wherein the plurality of heat sinks comprises:
a first heat sink configured for receipt in a first planar recess of the manifold body; and
a second heat sink configured for receipt in a second planar recess of the manifold body.

18. The power electronics module of claim 17, wherein:
the impingement surface of the first heat sink is configured for fluidic communication with the manifold insert fluid channels at the first planar surface of the manifold insert, and the impingement surface of the second heat sink is configured for fluidic communication with the manifold insert fluid channels at the second planar surface of the manifold insert; and
the heat transfer surface of the first heat sink is configured for thermal communication with the one or more electronic devices, and the heat transfer surface of the second heat sink is configured for thermal communication with the one or more electronic devices.

19. The power electronics module of claim 15, wherein each manifold insert is oriented and the manifold micro-channel cold plate cells are interconnected such that a coolant fluid flows through each manifold micro-channel cold plate cell in series.

20. The power electronics module of claim 15, wherein each manifold insert is oriented and the manifold micro-channel cold plate cells are interconnected such that a coolant fluid flows through each manifold micro-channel cold plate cell in parallel.

* * * * *